US012779570B2

(12) United States Patent
Lee

(10) Patent No.: US 12,779,570 B2
(45) Date of Patent: Nov. 3, 2026

(54) METHOD OF MANUFACTURING POWER MODULE

(71) Applicant: AMOSENSE CO., LTD., Cheonan-si (KR)

(72) Inventor: Jihyung Lee, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 146 days.

(21) Appl. No.: 18/284,970

(22) PCT Filed: Mar. 18, 2022

(86) PCT No.: PCT/KR2022/003797
§ 371 (c)(1),
(2) Date: Sep. 29, 2023

(87) PCT Pub. No.: WO2022/211329
PCT Pub. Date: Oct. 6, 2022

(65) Prior Publication Data

US 2024/0181548 A1 Jun. 6, 2024

(30) Foreign Application Priority Data

Mar. 31, 2021 (KR) ........................ 10-2021-0041702

(51) Int. Cl.

| | |
|---|---|
| ***B23K 1/00*** | (2006.01) |
| ***H10W 70/05*** | (2026.01) |
| ***H10W 72/00*** | (2026.01) |
| *H10W 40/22* | (2026.01) |
| *H10W 40/25* | (2026.01) |

(52) U.S. Cl.
CPC ......... *B23K 1/0016* (2013.01); *H10W 70/093* (2026.01); *H10W 72/00* (2026.01); *H10W 40/22* (2026.01); *H10W 40/25* (2026.01)

(58) Field of Classification Search
None
See application file for complete search history.

(56) References Cited

U.S. PATENT DOCUMENTS

| | | | | |
|---|---|---|---|---|
| 5,219,794 A * | 6/1993 | Satoh | .................... | H10W 95/00 438/126 |
| 5,332,463 A * | 7/1994 | Eberlein | ............... | H10W 95/00 269/903 |
| 6,213,376 B1 * | 4/2001 | Correia | ................... | H10P 72/74 257/E21.705 |

(Continued)

FOREIGN PATENT DOCUMENTS

| | | |
|---|---|---|
| EP | 3 208 839 A1 | 8/2017 |
| JP | 3171023 B2 | 5/2001 |

(Continued)

OTHER PUBLICATIONS

KR Office Action dated May 24, 2023 as received in Application No. 10-2021-0041702.

*Primary Examiner* — Devang R Patel
(74) *Attorney, Agent, or Firm* — Maschoff Brennan

(57) ABSTRACT

The present invention relates to a method of manufacturing a power module. The method involves joining a base plate and a ceramic substrate by brazing while pressing same with an upper jig and a lower jig, and thus can suppress bending, improve joint reliability, and increase heat dissipation.

8 Claims, 8 Drawing Sheets

(56) References Cited

U.S. PATENT DOCUMENTS

| | | | | |
|---|---|---|---|---|
| 7,350,988 | B2 * | 4/2008 | Nagasaka | G02B 6/4201 385/94 |
| 8,188,597 | B2 * | 5/2012 | Lombardi | B23K 1/0016 257/726 |
| 8,540,506 | B2 * | 9/2013 | Lin | H10W 74/01 425/405.1 |
| 10,014,273 | B2 * | 7/2018 | Lombardi | B23K 1/0016 |
| 11,363,725 | B2 * | 6/2022 | Dionne | H05K 13/0076 |
| 2010/0097738 | A1 | 4/2010 | Kang et al. | |
| 2012/0305304 | A1 | 12/2012 | Kato et al. | |
| 2017/0141011 | A1 | 5/2017 | Oohiraki et al. | |

FOREIGN PATENT DOCUMENTS

| | | | | |
|---|---|---|---|---|
| JP | 2013-048294 | A | | 3/2013 |
| JP | 2015170825 | A | * | 9/2015 |
| JP | 2016-167548 | A | | 9/2016 |
| KR | 10-2010-0043478 | A | | 4/2010 |
| KR | 10-2017-0026503 | A | | 3/2017 |
| KR | 10-2017-0073618 | A | | 6/2017 |
| KR | 20170060523 | A | * | 6/2017 |

* cited by examiner

[FIG. 1]
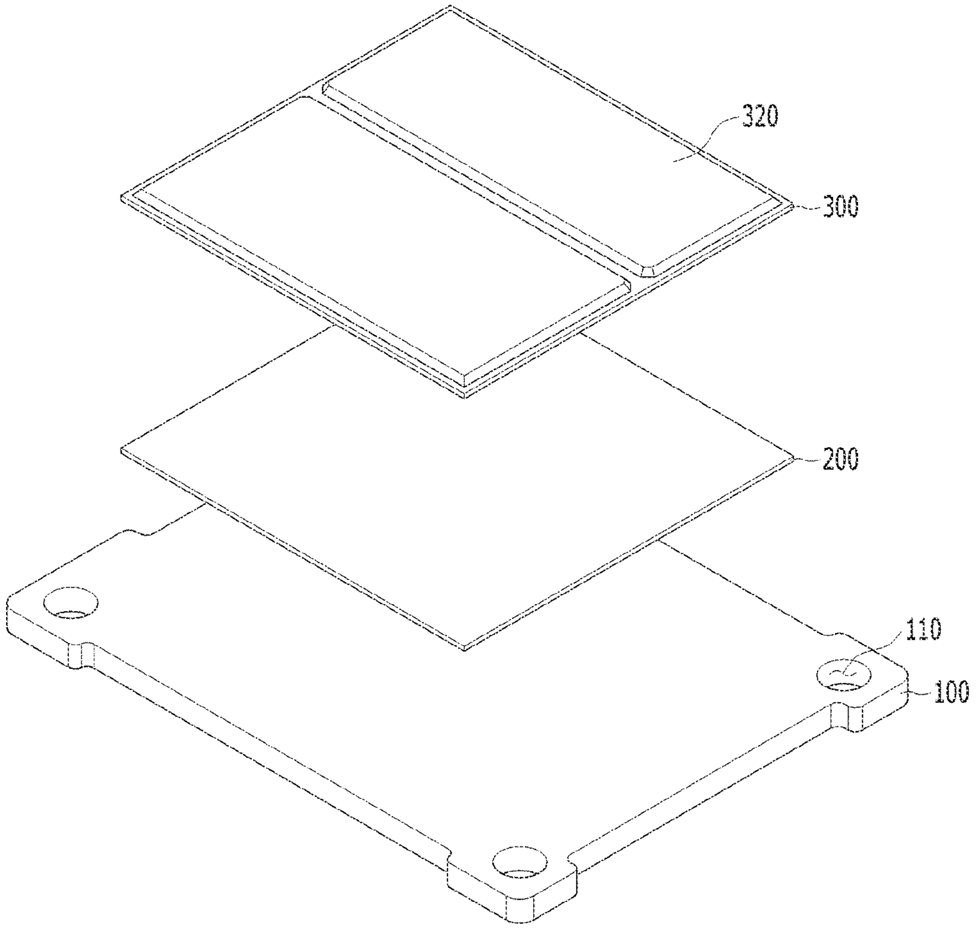

[FIG. 2]
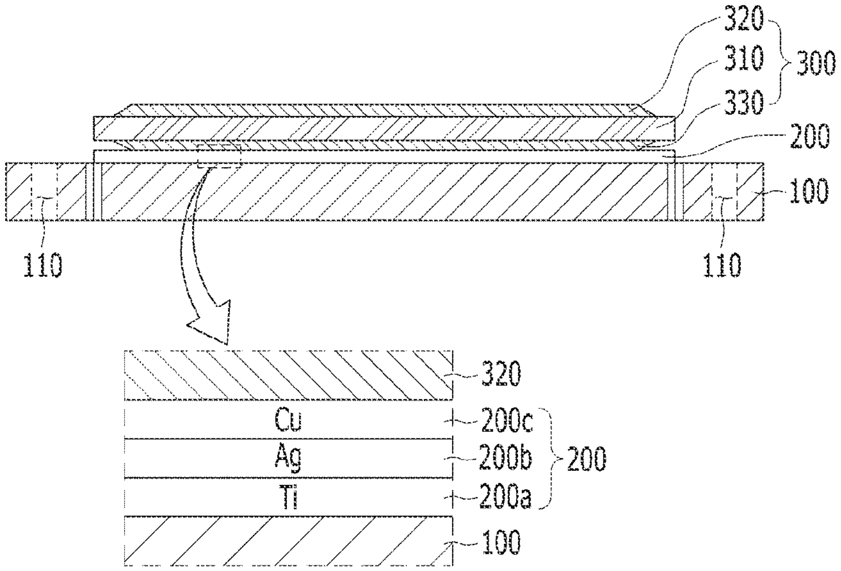

[FIG. 3]
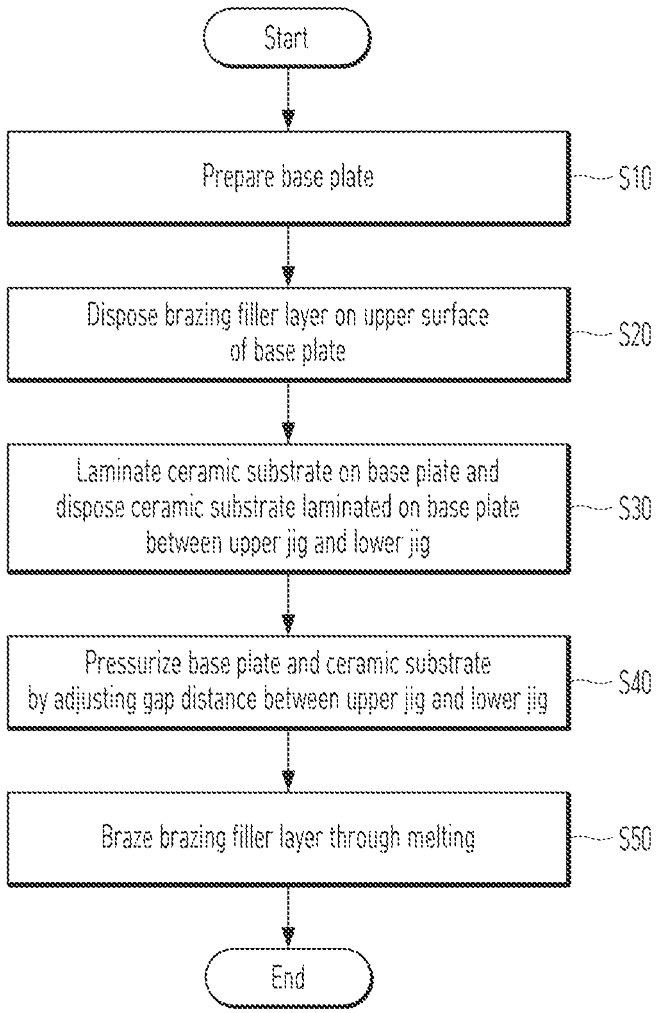

[FIG. 4]
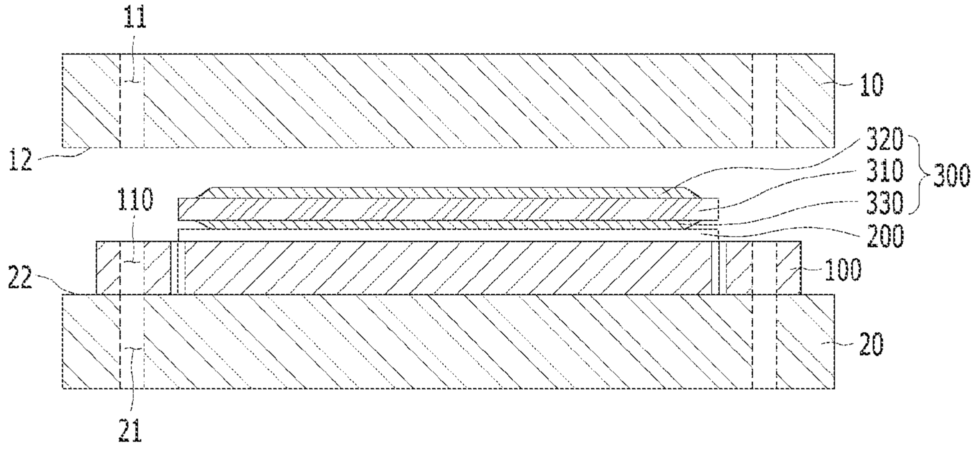
[FIG. 5]

[FIG. 6]
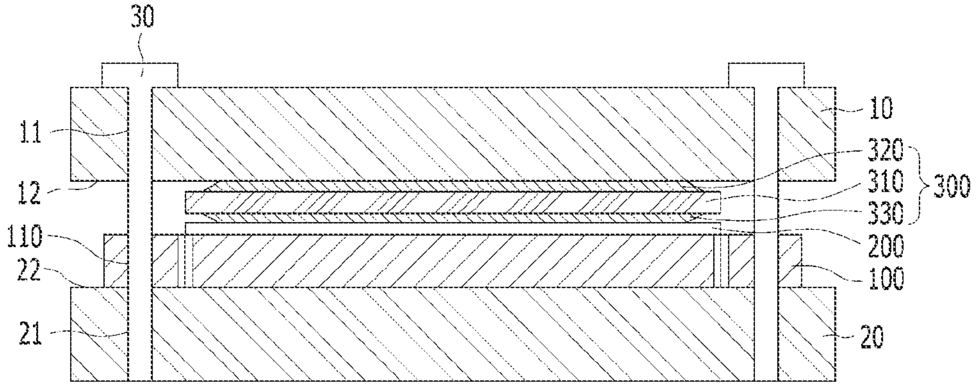
[FIG. 7]
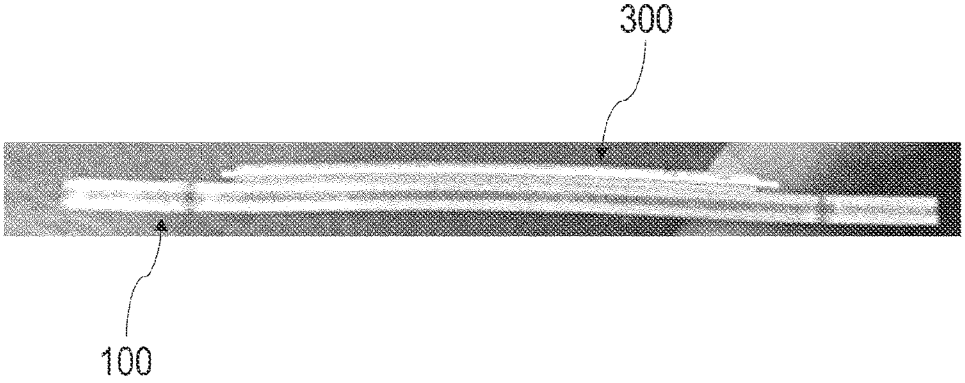

[FIG. 8]
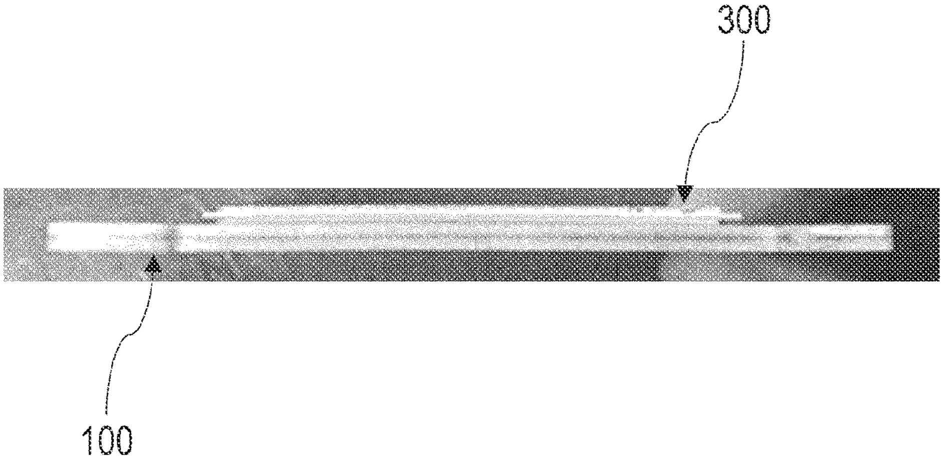

[FIG. 9]
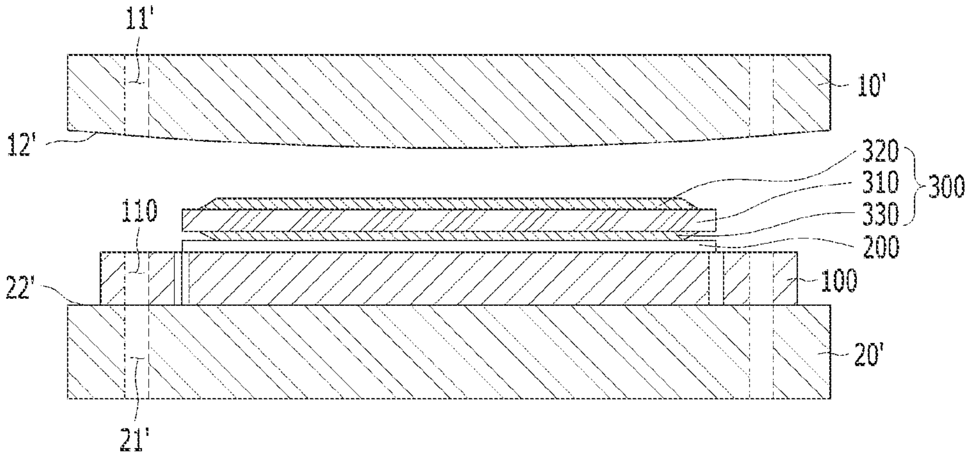
[FIG. 10]
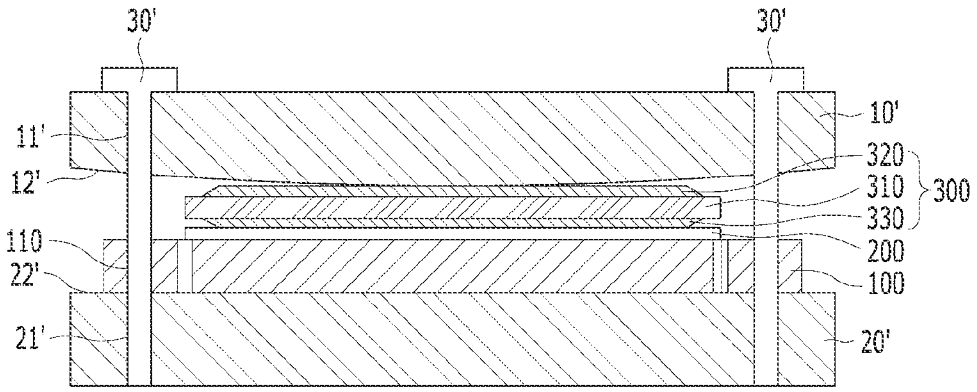

[FIG. 11]
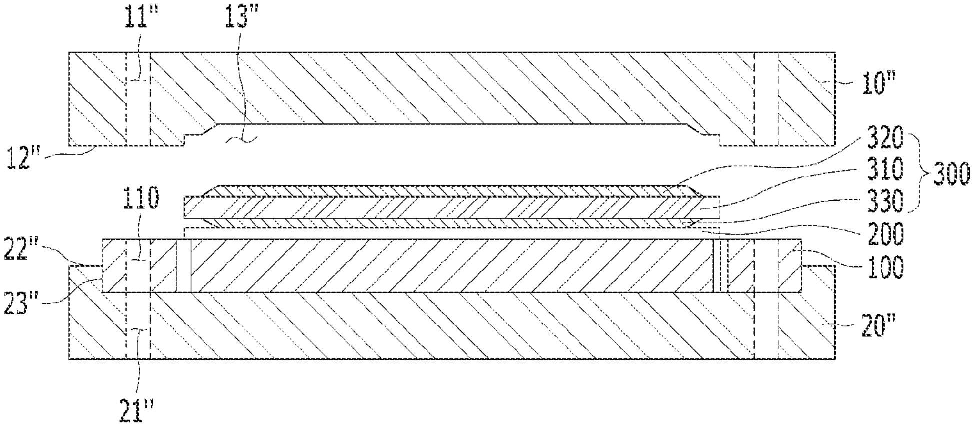

METHOD OF MANUFACTURING POWER MODULE

TECHNICAL FIELD

The present disclosure relates to a method of manufacturing a power module, and more particularly, to a method of manufacturing a power module having a bonding structure of a base plate and a ceramic substrate.

BACKGROUND ART

Generally, in a power module, a base plate is formed in a rectangular plate shape, and is formed of an aluminum or copper material. Such a base plate may be bonded onto a lower surface of a ceramic substrate, and may be used as a heat sink. The base plate may be bonded by soldering onto the lower surface of the ceramic substrate so as to be good for heat dissipation.

However, since the base plate in the related art has a thermal expansion coefficient of 17 ppm/K, a flexure may occur due to a difference between thermal expansion coefficients of the base plate and the ceramic substrate during bonding with the ceramic substrate. Further, solder paste may melt at a high temperature to cause the flexure or defect of the base plate.

As solution schemes for this, the ceramic substrate and the base plate are bonded at a temperature equal to or lower than 250° C. with AlSiC or similar materials. However, in such a method, not only process costs are increased due to the usage of the solder paste, a solder preform, and vacuum bonding equipment during bonding, but also the flexure problem still occurs due to the difference between the thermal expansion coefficients of the ceramic substrate and the base plate, thereby causing problems of bonding reliability and yield.

SUMMARY OF INVENTION

Technical Problem

An object of the present disclosure is to provide a method of manufacturing a power module, which can improve bonding reliability of a base plate and a ceramic substrate, can achieve high-reliability bonding for various base plates, and can achieve process simplification and saving of process costs.

Solution to Problem

In order to achieve the above object, a method of manufacturing a power module according to an embodiment of the present disclosure may include: preparing a base plate; disposing a brazing filler layer on an upper surface of the base plate; laminating a ceramic substrate on the base plate and disposing the ceramic substrate laminated on the base plate between an upper jig and a lower jig; pressurizing the base plate and the ceramic substrate by adjusting a gap distance between the upper jig and the lower jig; and brazing the brazing filler layer through melting.

In the step of disposing between the upper jig and the lower jig, a plurality of fastening holes may be formed at edges of the upper jig and the lower jig, and a plurality of insertion holes formed at an edge of the base plate may be disposed to face the plurality of fastening holes.

In the step of pressurizing the base plate and the ceramic substrate, bolts may be screw-fastened through the fastening holes of the upper jig, the insertion holes of the base plate, and the fastening holes of the lower jig, and the gap distance between the upper jig and the lower jig may be adjusted by rotation of the bolts.

In the step of disposing between the upper jig and the lower jig, the upper jig may be provided with one surface that comes in contact with the ceramic substrate as a plane, and the lower jig may be provided with one surface that comes in contact with the base plate as a plane.

In the step of disposing between the upper jig and the lower jig, the upper jig may be provided with one surface which comes in contact with the ceramic substrate and which is convex toward the ceramic substrate, and the lower jig may be provided with one surface that comes in contact with the base plate as a plane.

In the step of disposing between the upper jig and the lower jig, the upper jig may have a first groove formed on one surface thereof, and may be provided to surround an outer surface of the ceramic substrate, and the lower jig may have a second groove formed on one surface thereof, and may be provided to surround an outer surface of the base plate.

In the step of disposing the brazing filler layer, the brazing filler layer having a thickness that is equal to or larger than 5 μm and equal to or smaller than 100 μm may be disposed on the upper surface of the base plate by any one method of paste application, foil attachment, and P-filler.

In the step of disposing the brazing filler layer, the brazing filler layer may be made of a material including at least one of Ag, Cu, AgCu, and AgCuTi.

The step of brazing may be performed at 780° C. to 900° C.

In the step of preparing the base plate, the base plate may be composed of at least one of Cu, Al, AlSiC, CuMo, CuW, Cu/CuMo/Cu, Cu/Mo/Cu, and Cu/W/Cu, or a composite material thereof.

In the step of disposing between the upper jig and the lower jig, the upper jig and the lower jig may be made of at least one material of S45C, SKD11, and SUS.

Advantageous Effects of Invention

According to the present disclosure, the bonding strength is heightened through the brazing of the base plate onto the ceramic substrate, and the process simplification is possible since the vacuum bonding equipment, such as usage of the solder preform, is not required.

Further, according to the present disclosure, since the base plate and the ceramic substrate brazed in a state where they are pressurized by the upper jig and the lower jig, the upper jig and the lower jig constrain the deformation of the base plate and the ceramic substrate, and thus the flexure can be restrained.

Further, according to the present disclosure, since the flexure of the base plate and the ceramic substrate can be restrained, the heat dissipation characteristic can be improved through an excellent heat transfer effect, and the dimensional accuracy can be improved when a post-process, such as sizing, is performed.

Further, according to the present disclosure, the heat dissipation effect can be maximized since the brazing filler layer facilitates the heat transfer and thus the heat of the ceramic substrate can be fast transferred to the base plate.

BRIEF DESCRIPTION OF DRAWINGS

FIG. 1 is an exploded perspective view illustrating a bonding structure of a base plate and a ceramic substrate for a power module according to an embodiment of the present disclosure.

FIG. 2 is a front view illustrating a bonding structure of a base plate and a ceramic substrate for a power module according to an embodiment of the present disclosure.

FIG. 3 is a flowchart illustrating a method of manufacturing a power module according to an embodiment of the present disclosure.

FIG. 4 is a front view illustrating a state where a ceramic substrate is laminated on a base plate and is disposed between an upper jig and the lower jig in a method of manufacturing a power module according to an embodiment of the present disclosure.

FIG. 5 is a plan view illustrating the upper jig and lower jig of FIG. 4.

FIG. 6 is a front view illustrating a state where a gap distance between an upper jig and a lower jig is adjusted in a method of manufacturing a power module according to an embodiment of the present disclosure.

FIG. 7 is a photograph showing a comparative example in which a base plate and a ceramic substrate are brazed without an upper jig and a lower jig.

FIG. 8 is a photograph showing an embodiment in which a ceramic substrate and a base plate are brazed in a pressurized state by using an upper jig and a lower jig.

FIG. 9 is a front view illustrating a state where a base plate and a ceramic substrate are disposed between an upper jig and a lower jig according to another embodiment of the present disclosure.

FIG. 10 is a front view illustrating a state where a gap distance between the upper jig and the lower jig of FIG. 9 is adjusted.

FIG. 11 is a front view illustrating a state where a base plate and a ceramic substrate are disposed between an upper jig and a lower jig according to still another embodiment of the present disclosure.

DESCRIPTION OF EMBODIMENTS

Hereinafter, embodiments of the present disclosure will be described in detail with reference to the accompanying drawings.

The drawings are merely for understanding of the subject matter of the present disclosure, and it should not be interpreted that the scope of the present disclosure is not limited by the drawings. Further, in the drawings, relative thicknesses, lengths, or sizes may be exaggerated for convenience and clarity of the explanation.

The present disclosure is featured on a bonding structure of a base plate and a ceramic substrate among constitutions included in a power module, and explanation will be made around this.

FIG. 1 is an exploded perspective view illustrating a bonding structure of a base plate and a ceramic substrate for a power module according to an embodiment of the present disclosure, and FIG. 2 is a cross-sectional view illustrating a bonding structure of a base plate and a ceramic substrate for a power module according to an embodiment of the present disclosure.

As illustrated in FIGS. 1 and 2, a power module according to an embodiment of the present disclosure may include a base plate 100, a brazing filler layer 200 disposed on an upper surface of the base plate 100, and a ceramic substrate 300 that is brazed onto the upper surface of the base plate 100 through the brazing filler layer 200.

In the power module, a semiconductor chip (not illustrated) may be mounted on an upper surface of the ceramic substrate 300. The semiconductor chip may be a semiconductor chip, such as Si, SiC, and GaN.

The ceramic substrate 300 may be any one of an active metal brazing (AMB) substrate, a direct bonded copper (DBC) substrate, and a thick printing copper (TPC) substrate. Here, in order to heighten the heat dissipation efficiency of heat being generated from the semiconductor chip, the ceramic substrate 300 may be provided as a ceramic substrate composed of a ceramic base material 310 and metal layers 320 and 330 formed on upper and lower surfaces of the ceramic base material 310.

As an example, the ceramic base material 310 may be any one of alumina ($Al_2O_3$), AlN, SiN, and $Si_3N_4$.

The metal layers 320 and 330 may be formed as an electrode pattern for mounting a semiconductor chip and an electrode pattern for mounting a driving element through brazing of a metal foil onto the ceramic base material 310. For example, the metal layers 320 and 330 may be formed as electrode patterns in an area where the semiconductor chip or peripheral parts are to be mounted. As an example, the metal foil is an aluminum foil or a copper foil. As an example, the metal foil is brazed onto the ceramic base material 310. Such a substrate is called an active metal brazing (AMB) substrate. In an embodiment, although the AMB substrate is exemplified, a direct bonding copper (DBC) substrate, a thick printing copper (TPC) substrate, or a direct brazed aluminum (DBA) substrate may also be applied. Here, the AMB substrate is most suitable for durability and heat dissipation efficiency.

The base plate 100 is bonded onto a lower surface of the ceramic substrate 300, and is used as a heat sink for dissipating heat that is generated from the semiconductor chip.

The base plate 100 may be formed in a rectangular plate shape having a predetermined thickness. The base plate 100 is formed of a material that can heighten the heat dissipation efficiency. As an example, the base plate 100 may be composed of at least one of Cu, Al, AlSiC, CuMo, CuW, Cu/CuMo/Cu, Cu/Mo/Cu, and Cu/W/Cu, or a composite material thereof. The materials of Cu, Al, AlSiC, CuMo, CuW, Cu/CuMo/Cu, Cu/Mo/Cu, and Cu/W/Cu have prominent thermal conductivity, and the materials of AlSiC, CuMo, CuW, Cu/CuMo/Cu, Cu/Mo/Cu, and Cu/W/Cu have a low thermal expansion coefficient, and thus can minimize the flexure occurrence when being bonded onto the ceramic substrate 300.

The base plate 100 may have a plurality of insertion holes 110 formed at edges thereof. As an example, the base plate may have four insertion holes 110 formed at the edges that are adjacent to four corners. The insertion holes 110 may be disposed to face a plurality of fastening holes 11 and 21 of an upper jig 10 and a lower jig 20 to be described later.

The brazing filler layer 200 may be disposed on an upper surface of the base plate 100. The brazing filler layer 200 is to secure the bonding characteristic between the base plate 100 and the ceramic substrate 300. The base plate 100 and the ceramic substrate 300 may be solder-bonded, but the solder bonding causes a gap occurrence due to a flexure occurrence at a high temperature, and has a low bonding reliability.

The brazing filler layer 200 has a thickness equal to or larger than 5 μm and equal to or smaller than 100 μm. The brazing filler layer 200 may be formed as a thin film of a multilayer structure. The thin film of the multilayer structure is to heighten the bonding force through complementation of the poor performance. The brazing filler layer 200 may be composed of a material including at least one of Ag, Cu, AgCu, and AgCuTi. The Ag and Cu have a high thermal conductivity, and thus heighten the heat dissipation efficiency by facilitating heat transfer between the ceramic substrate 300 and the base plate 100 simultaneously with the role of heightening the bonding force. The Ti has a good wettability, and thus facilitates attachment of Ag and Cu onto the base plate 100.

As an example, the brazing filler layer 200 may be composed of a two-layer structure including an Ag layer and a Cu layer formed on the Ag layer. Further, the brazing filler layer 200 may be composed of a three-layer structure including a Ti layer 200*a*, an Ag layer 200*b* formed on the Ti layer 200*a*, and a Cu layer 200*c* formed on the Ag layer 200*b*. The brazing filler layer 200 may be used for bonding of the base plate 100 and the ceramic substrate 300, and after the brazing, the boundary of the multilayer structure may become ambiguous.

It is preferable that the brazing filler layer 200 has a volume in the range of 85 to 115% in comparison to the volume of the metal layer 330 provided on a lower part of the ceramic substrate 300. The volume of the brazing filler layer 200 means bonding area×height. If there is a big difference between volumes of the brazing filler layer and the metal layer 330 of the ceramic substrate 300, there is a problem in that the degree of flexure becomes greater. Accordingly, in consideration of the bonding area and the volume of the base plate 100, it is preferable that the brazing filler layer 200 is designed to have the volume in the range of 85 to 115% in comparison to the volume of the metal layer 330 of the ceramic substrate 300.

FIG. 3 is a flowchart illustrating a method of manufacturing a power module according to an embodiment of the present disclosure.

As illustrated in FIG. 3, a method of manufacturing a power module according to an embodiment of the present disclosure may include: preparing a base plate 100 (S10); disposing a brazing filler layer 200 on an upper surface of the base plate 100 (S20); laminating a ceramic substrate 300 on the base plate 100 and disposing the ceramic substrate laminated on the base plate between an upper jig 10 and a lower jig 20 (S30); pressurizing the base plate 100 and the ceramic substrate 300 by adjusting a gap distance between the upper jig 10 and the lower jig 20 (S40); and brazing the brazing filler layer 200 through melting.

In the step (S10) of preparing the base plate 100, the base plate 100 may be composed of at least one of Cu, Al, AlSiC, CuMo, CuW, Cu/CuMo/Cu, Cu/Mo/Cu, and Cu/W/Cu, or a composite material thereof. Preferably, the base plate 100 may be composed of at least one of AlSiC, CuMo, CuW, Cu/CuMo/Cu, Cu/Mo/Cu, and Cu/W/Cu, or a composite material thereof. The materials of AlSiC, CuMo, CuW, Cu/CuMo/Cu, Cu/Mo/Cu, and Cu/W/Cu have a low thermal expansion coefficient in comparison to Cu and Al, and thus can minimize a flexure phenomenon occurring due to a difference between thermal expansion coefficients thereof at a high temperature.

The base plate 100 may be composed of a multilayer structure to have a low thermal expansion coefficient (low CTE). Specifically, the base plate 100 may be composed of a multilayer structure in which Cu metal sheets having an excellent thermal conductivity are bonded onto upper and lower surfaces of a metal sheet that is one of Mo, W, CuMo, and CuW, having the low CTE. In case of the base plate 100 formed as a 3-layer structure of Cu/CuMo/Cu, CuMo has a low thermal expansion coefficient and is to prevent the flexure, and Cu is to secure the thermal conductivity for heat dissipation. That is, even if the flexure occurs in the Cu metal sheet, the CuMo metal sheet can absorb and suppress the flexure.

The thickness of the base plate 100 may be in the range of 1.0 mm to 3.0 mm. Preferably, the thickness of the base plate 100 becomes equal to or larger than 2.0 mm, and thus is good for heat dissipation to minimize the flexure occurrence.

In the step (S20) of disposing the brazing filler layer 200 on the upper surface of the base plate 100, the brazing filler layer 200 having a thickness that is equal to or larger than 5 μm and equal to or smaller than 100 μm may be disposed on the upper surface of the base plate 100 by any one method of paste application, foil attachment, and P-filler. The brazing filler layer 200 may be made of a material including at least one of Ag, Cu, AgCu, and AgCuTi.

In the step (S30) of laminating the ceramic substrate 300 on the base plate 100 and disposing the ceramic substrate 300 laminated on the base plate 100 between the upper jig 10 and the lower jig 20 (S30), the ceramic substrate 300 may be provided as the ceramic substrate 300 including a ceramic base material 310 and metal layers 320 and 330 brazed on upper and lower surfaces of the ceramic base material 310. As an example, the ceramic substrate may be provided as any one of an AMB substrate, a DBC substrate, a TPC substrate, and a DBA substrate.

In case that the ceramic substrate 300 is laminated on the base plate 100, the metal layer 330 provided on the lower surface of the ceramic substrate 300 and the base plate 100 may be disposed in a position where they can be bonded together through the brazing filler layer 200. Accordingly, in case that a semiconductor chip is mounted on the metal layer 320 provided on the upper surface of the ceramic substrate 300, heat that is generated from the semiconductor chip can be easily dissipated through the base plate 100 bonded onto the lower part of the ceramic substrate 300.

FIG. 4 is a front view illustrating a state where a ceramic substrate is laminated on a base plate and is disposed between an upper jig and the lower jig in a method of manufacturing a power module according to an embodiment of the present disclosure, and FIG. 5 is a plan view illustrating the upper jig and lower jig of FIG. 4.

As illustrated in FIGS. 4 and 5, in the step (S30) of disposing between the upper jig 10 and the lower jig 20, the upper jig 10 and the lower jig 20 may be rectangular metal plates. Here, the upper jig 10 may be provided with one surface 12 that comes in contact with the ceramic substrate 300 as a plane, and the lower jig 20 may be provided with one surface 22 that comes in contact with the base plate 100 as a plane.

The upper jig 10 and the lower jig 20 may be made of at least one material of S45C, SKD11, and stainless use steel (SUS) to constrain the deformation of the base plate 100 and the ceramic substrate 300. Such a mold steel material or tool steel material has a high stiffness, and thus can effectively suppress the flexure of the base plate 100 and the ceramic substrate 300. As an example, the thickness of the upper jig 10 and the lower jig 20 is 10T.

A plurality of fastening holes 11 and 21 may be formed at edges of the upper jig 10 and the lower jig 20. As an example, four fastening holes 11 and 21 may be formed at the edges adjacent to four corners of the upper jig 10 and the lower jig 20, and the fastening holes 11 of the upper jig 10 and the fastening holes 21 of the lower jig 20 may be formed to face each other.

A plurality of insertion holes 110 may be formed at an edge of the base plate 100. When the ceramic substrate 300 is laminated on the base plate 100 and is disposed between the upper jig 10 and the lower jig 20, the plurality of insertion holes 110 of the base plate 100 may be disposed to face a plurality of fastening holes 11 and 21.

FIG. 6 is a front view illustrating a state where a gap distance between an upper jig and a lower jig is adjusted in a method of manufacturing a power module according to an embodiment of the present disclosure.

As illustrated in FIG. 6, in the step (S40) of pressurizing the base plate 100 and the ceramic substrate 300 through adjustment of a gap distance between the upper jig 10 and the lower jig 20, a plurality of bolts 30 may be fastened through the plurality of insertion holes 110 and the plurality of fastening holes 11 and 21 to unify the upper jig 10, the base plate 100, and the lower jig 20.

Here, the bolts 30 may be inserted through the fastening hole 11 of the upper jig 10, the insertion hole 110 of the base plate, and the fastening hole 21 of the lower jig 20, and may be screw-engaged with threads formed on inner surfaces of the fastening holes 11 and 21 of the upper jig 10 and the lower jig 20. In this case, by rotating the bolts 30 to be fastened or unfastened, the gap distance between the upper jig 10 and the lower jig 20 can be adjusted.

The gap distance between the upper jig 10 and the lower jig 20 may be adjusted so that a restraining force enough to fix the position of the base plate 100 and the ceramic substrate 300 is applied. That is, it is preferable that the gap distance between the upper jig 10 and the lower jig 20 is adjusted only to the extent that the flexure can be suppressed as far as it does not damage the base plate 100 and the ceramic substrate 300.

As described above, the present disclosure is featured to maximally suppress the flexure during brazing by pressurizing the base plate 100 and the ceramic substrate 300 with the upper jig 10 and the lower jig 20 before the step (S50) of brazing the brazing filler layer through melting.

The thermal expansion coefficient of the ceramic substrate 300 is about 6.8 ppm/K, and there is a big difference between the thermal expansion coefficients of the ceramic substrate 300 and the base plate 100, of which the thermal expansion coefficient is 17 ppm/K. Accordingly, the flexure occurs due to the difference between the thermal expansion coefficients of the base plate 100 and the ceramic substrate 300 during the brazing at a high temperature. If the difference between the thermal expansion coefficients is large, the degree of flexure is large, and thus there is a limit in removing the flexure even if a shaping process, such as sizing, is performed.

FIG. 7 is a photograph showing a comparative example in which a base plate 100 and a ceramic substrate 300 are brazed without an upper jig 10 and a lower jig 20, and FIG. 8 is a photograph showing an embodiment in which a ceramic substrate 300 and a base plate 100 are brazed in a pressurized state by using an upper jig 10 and a lower jig 20.

As shown in FIG. 7, the flexure occurred in the form in which the base plate 100 and the ceramic substrate 300 were convex upwardly, and the degree of the flexure appeared to be about 0.832 mm.

In contrast, as shown in FIG. 8, the flexure appeared to be suppressed in a manner that the degree of the flexure of the base plate 100 and the ceramic substrate 300 was about 0.124 mm. As described above, according to the present disclosure, the base plate 100 and the ceramic substrate 300 are brazed in a state of being pressurized by using the upper jig 10 and the lower jig 20, and thus the flexure can be maximally suppressed. Since the upper jig 10 and the lower jig 20 are formed of a material having high stiffness, such as S45C, SKD11, and SUS, deformation of the base plate 100 and the ceramic substrate 300 can be maximally suppressed even at a high temperature.

Since the flexure of the base plate 100 and the ceramic substrate 300 is suppressed, the thermal transfer effect becomes excellent to improve the heat dissipation characteristic, and the dimensional accuracy can be improved when a post-process, such as sizing, is performed.

In the step (S50) of brazing the brazing filler layer 200 through melting, the brazing filler layer 200 can be melted through disposition of the base plate 100 and the ceramic substrate 300, which are pressurized by the upper jig 10 and the lower jig 20, in a brazing furnace (not illustrated).

In the brazing furnace, an efficient brazing process is performed by controlling the heating temperature to be equal to or higher than 450° C., and preferably, in the range of 780 to 900° C. As an example, a preferable brazing temperature is 870° C.

Since the brazing of the base plate 100 and the ceramic substrate 300 by melting the brazing filler layer 200 does not require vacuum bonding equipment, such as usage of a solder preform, the process simplification is possible, and the bonding reliability is heightened through the high bonding strength.

Through the brazing step (S50), the base plate 100 may be unified with the ceramic substrate 300.

FIG. 9 is a front view illustrating a state where a base plate and a ceramic substrate are disposed between an upper jig and a lower jig according to another embodiment of the present disclosure, and FIG. 10 is a front view illustrating a state where a gap distance between the upper jig and the lower jig of FIG. 9 is adjusted.

As illustrated in FIGS. 9 and 10, in the step (S30) of disposing between an upper jig 10' and a lower jig 20', the upper jig 10' according to another embodiment may be provided with a fastening hole 11' that is fastened to a bolt 30', and one surface 12' that comes in contact with the ceramic substrate 300 may be provided to be convex toward the ceramic substrate 300. The lower jig 20' may be provided with a fastening hole 21' that is fastened to the bolt 30', and one surface 22' that comes in contact with the base plate 100 may be provided as a plane.

Referring to FIG. 7, the flexure occurs in the form in which the center part of the base plate 100 and the ceramic substrate 300 is convex upwardly.

Accordingly, in case that the one surface 12' of the upper jig 10', which comes in contact with the ceramic substrate 300, is provided to be convex toward the ceramic substrate 300, it is possible to pressurize the center part of the ceramic substrate 300, of which the degree of the flexure is large, a little stronger.

FIG. 11 is a front view illustrating a state where a base plate and a ceramic substrate are disposed between an upper jig and a lower jig according to still another embodiment of the present disclosure.

As illustrated in FIG. 11, in the step (S30) of disposing between an upper jig 10" and a lower jig 20", the upper jig 10" according to still another embodiment may be provided with a fastening hole 11" that is fastened to a bolt, and a first groove 13" for accommodating the ceramic substrate 300 may be formed on one surface 12" thereof to surround an outer surface of the ceramic substrate 300. As an example, the first groove 13" of the upper jig 10" may be formed to have a size enough to surround the metal layer 320 and a part of the ceramic base material 310 of the ceramic substrate 300, but the size of the first groove 13" is not limited thereto, and may be properly changed.

Further, the lower jig 20" may be provided with a fastening hole 21" that is fastened to a bolt, and a second groove 23" for accommodating the base plate 100 may be formed on one surface 22" thereof to surround an outer surface of the base plate 100. As an example, the second groove 23" of the lower jig 20" may be formed to have a size enough to surround a part of the base plate 100, but the size of the second groove 23" is not limited thereto, and may be properly changed.

As described above, in case that the first and second grooves 13" and 23" are formed on the upper jig 10" and the lower jig 20", the ceramic substrate 300 and the base plate 100 may be inserted to come in contact with the inner surfaces of the first and second grooves 13" and 23". In this case, the upper jig 10" may have a widened contact area with the ceramic substrate 300 due to the first groove 13", and may have a widened contact area with the base plate 100 due to the second groove 23". As the contact areas of the upper jig 10" and the lower jig are widened as described above, the flexure of the ceramic substrate 300 and the base plate 100 may be suppressed a little stronger. Further, an accurate mutual alignment of the ceramic substrate 300 and the base plate 100 can be easily made by using the first and second grooves 13" and 23", and the bonding accuracy can be improved since there is no problem of getting out of their positions in a high-temperature environment during brazing.

Meanwhile, in the present disclosure, although it is exemplarily illustrated that the base plate 100 is bonded onto the metal layer 330 of the ceramic substrate 300, the bonding of the base plate 100 is not limited thereto, and the base plate 100 can be bonded even onto an area where the metal layer 330 is not formed on the ceramic substrate 300 through the brazing filler layer 200.

According to the present disclosure as described above, since the base plate and the ceramic substrate are brazed in a state where they are pressurized by the upper jig and the lower jig, the upper jig and the lower jig constrain the deformation of the base plate and the ceramic substrate, and thus the flexure thereof can be restrained with the high heat dissipation effect.

Further, since the brazing does not require the vacuum bonding equipment, such as the usage of the solder preform in the related art, the process simplification is possible to contribute to the saving of the process cost, and the bonding reliability can be heightened through the high bonding reliability.

Although it has been exemplarily explained that the above-described bonding structure of the base plate and the ceramic substrate is applied to the power module, it can be applied to various bonding structures requiring high-reliability bonding.

Further, although the present disclosure has been described through separation into an embodiment, another embodiment, and still another embodiment, the embodiments can be mixedly applied.

Preferred embodiments of the present disclosure have been disclosed in the drawings and the description. Here, although specific terms have been used, this is merely for the purpose of explaining the present disclosure, but is not for limiting the meanings or limiting the scope of the present disclosure described in claims. Accordingly, it will be understood by those of ordinary skill in the art to which the present disclosure pertains that various modifications or other equivalent embodiments are possible therefrom. Accordingly, the authentic technical scope of the present disclosure should be determined by the technical ideas of the appended claims.

The invention claimed is:

1. A method of manufacturing a power module, the method comprising:

preparing a base plate;

disposing a brazing filler layer on an upper surface of the base plate;

laminating a ceramic substrate on the base plate and disposing the ceramic substrate laminated on the base plate between an upper jig and a lower jig, wherein the ceramic substrate includes a ceramic base material and a metal layer formed on an upper surface of the ceramic base material, wherein the upper jig has a first groove formed on one surface thereof, the first groove being configured to accommodate the ceramic substrate, and is provided to surround an outer side surface of the ceramic substrate, wherein the first groove is formed to come in contact with an upper surface and a side surface of the metal layer, and to come in contact with an upper surface and a side surface of a part of the ceramic base material extending outside the metal layer, and wherein the lower jig has a second groove formed on one surface thereof, the second groove being configured to accommodate the base plate, and is provided to surround an outer side surface of the base plate, wherein the second groove is formed to come in contact with a lower surface and a side surface of the base plate;

pressurizing the base plate and the ceramic substrate by adjusting a gap distance between the upper jig and the lower jig; and brazing the brazing filler layer through melting.

2. The method of claim 1, wherein in the step of disposing between the upper jig and the lower jig, a plurality of fastening holes are formed at edges of the upper jig and the lower jig, and a plurality of insertion holes formed at an edge of the base plate are disposed to face the plurality of fastening holes.

3. The method of claim 2, wherein in the step of pressurizing the base plate and the ceramic substrate, bolts are screw-fastened through the fastening holes of the upper jig, the insertion holes of the base plate, and the fastening holes of the lower jig, and the gap distance between the upper jig and the lower jig is adjusted by rotation of the bolts.

4. The method of claim 1, wherein in the step of disposing the brazing filler layer, the brazing filler layer having a thickness that is equal to or larger than 5 μm and equal to or smaller than 100 μm is disposed on the upper surface of the base plate by any one method of paste application, foil attachment, and P-filler.

5. The method of claim 1, wherein in the step of disposing the brazing filler layer, the brazing filler layer is made of a material including at least one of Ag, Cu, AgCu, and AgCuTi.

6. The method of claim 1, wherein the step of brazing is performed at 780° C. to 900° C.

7. The method of claim 1, wherein in the step of preparing the base plate, the base plate is composed of at least one of Cu, Al, AlSiC, CuMo, CuW, Cu/CuMo/Cu, Cu/Mo/Cu, and Cu/W/Cu, or a composite material thereof.

8. The method of claim 1, wherein in the step of disposing between the upper jig and the lower jig, the upper jig and the lower jig are made of at least one material of S45C, SKD11, and SUS.

* * * * *